(12) United States Patent
Jung et al.

(10) Patent No.: US 7,728,325 B2
(45) Date of Patent: Jun. 1, 2010

(54) DISPLAY DEVICE

(75) Inventors: Kwang-chul Jung, Seongnam-si (KR); Beohm-rock Choi, Seoul (KR); Joon-chul Goh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 11/566,950

(22) Filed: Dec. 5, 2006

(65) Prior Publication Data

US 2007/0152922 A1    Jul. 5, 2007

(30) Foreign Application Priority Data

Dec. 13, 2005    (KR)    ........................ 10-2005-0122751

(51) Int. Cl.
*H01L 35/24* (2006.01)

(52) U.S. Cl. ............................ 257/40; 257/59; 257/79; 257/88; 257/257

(58) Field of Classification Search .................... 257/57, 257/59, 66, 72, 347, 350, 351, E29.273–E29.299, 257/E29.314, E29.32, E23.016, 40, 79, 88; 313/498–502; 315/169.3, 169.4; 349/39, 349/41, 42, 142, 143, 144; 438/155, 158
See application file for complete search history.

(56) References Cited

U.S. PATENT DOCUMENTS 6,262,531 B1    7/2001    Inoguchi et al.

2004/0079941 A1*    4/2004    Yamazaki et al. ............. 257/40
2006/0055313 A1*    3/2006    Bae et al. .................... 313/500
2006/0202205 A1*    9/2006    Lee et al. ...................... 257/59

FOREIGN PATENT DOCUMENTS

| CN | 1410966 | 4/2003 |
|---|---|---|
| CN | 1758311 | 4/2006 |
| JP | 04006086 | 1/1992 |
| JP | 2001236025 | 8/2001 |
| JP | 2003133064 | 5/2003 |
| JP | 2005157353 | 6/2005 |
| KR | 1020050067832 | 7/2005 |

OTHER PUBLICATIONS

Korean Intellectual Property Office Notice of Official Action for Patent Application No. 10-2005-0122751; Date of Mailing: Nov. 24, 2006 (English Translation provided) (All the references cited in the Office action are listed above.).

* cited by examiner

*Primary Examiner*—Dung A. Le
(74) *Attorney, Agent, or Firm*—Cantor Colburn LLP

(57) ABSTRACT

A display device includes an insulating substrate including a display region, at least one pad disposed in a non-display region on the insulating substrate which applies a voltage to the display region, a connecting part which is electrically connects at least two pads or at least two portions of the pad; and a power supply unit which applies the voltage to the pad.

17 Claims, 6 Drawing Sheets

DISPLAY DEVICE

This application claims priority to Korean Patent Application No. 2005-0122751, filed on Dec. 13, 2005, and all the benefits accruing therefrom under 35 U.S.C. §119, the contents of which in its entirety are herein incorporated by reference.

BACKGROUND OF THE INVENTION

1. Field of the Invention

The present invention relates to a display device, and more particularly, to a display device which is applied with a driving voltage or a common voltage.

2. Description of the Related Art

Recently, organic light emitting diode ("OLED") devices have attracted attention and interest in the industry of flat panel display devices because of their low-power requirements, light weight, slim shape, wide viewing angle, high-speed response, and other beneficial attributes.

In an OLED device, a plurality of thin film transistors ("TFTs") are formed on an OLED substrate. The TFTs include a switching transistor connected to a data line and a driving transistor connected to a voltage supply line, wherein the lines form the boundary of a pixel. Pads are disposed on the OLED substrate to supply voltages, such as a common voltage and a driving voltage, to OLEDs of the OLED device.

A gate driving part and a data driving part, which apply a gate voltage and a data voltage to the gate line and data line respectively, may be formed on the OLED substrate by a chip on glass ("COG") method. When applied by the COG method the driving parts are fixed to certain places of the OLED substrate and thereafter do not move. With space on the OLED substrate being thus occupied by the gate and data driving parts space for the pads which supply the driving voltage and the common voltage are limited.

Due to this space limitation, the driving voltage and the common voltage may not be sufficiently supplied to the display device, and thus an overall brightness of the display device may decrease and may not be uniform.

BRIEF SUMMARY OF THE INVENTION

Accordingly, it is an aspect of the present invention to provide a display device in which a driving voltage and/or a common voltage is stably and sufficiently supplied throughout the display region, thereby providing a display having uniform brightness.

The foregoing and/or other aspects of the present invention are achieved by providing an exemplary embodiment of a display device including an insulating substrate, a display region disposed on the insulating substrate, at least one pad disposed in a non-display region on the insulating substrate, wherein the at least one pad applies a voltage to the display region, at least one connecting part which electrically connects at least two pads or at least two portions of the pad, and a power supply unit which applies the voltage to the pad.

According to an exemplary embodiment of the present invention, the connecting part comprises metal.

According to an exemplary embodiment of the present invention, the connecting part comprises a flexible printed circuit.

According to an exemplary embodiment of the present invention, the connecting part is provided in a single body with the power supply unit.

According to an exemplary embodiment of the present invention, the display device further comprises at least one voltage supply line disposed in the display region, and wherein the voltage is a driving voltage applied to the voltage supply line.

According to an exemplary embodiment of the present invention, the pad comprises a first sub-pad and a second sub-pad, wherein the first sub-pad and second sub-pad are separated from each other with the display region disposed therebetween, and wherein the connecting part connects the first sub-pad and the second sub-pad.

According to an exemplary embodiment of the present invention, the at least one connecting part comprises a plurality of connecting parts.

According to an exemplary embodiment of the present invention, the connecting parts are disposed substantially in parallel.

According to an exemplary embodiment of the present invention, the display device further comprises at least one data line formed substantially in parallel with the voltage supply line in the display region and a data driving part which applies a data voltage to the data line, wherein the data driving part is disposed adjacent to one of the first sub-pad and the second sub-pad.

According to an exemplary embodiment of the present invention, the display device further comprises a common electrode formed substantially throughout the display region, wherein the voltage is a common voltage applied to the common electrode.

According to an exemplary embodiment of the present invention, the pad is formed along one side of the insulating substrate, and the connecting part connects opposite end portions of the pad.

According to an exemplary embodiment of the present invention, the data driving part is disposed on the insulating substrate.

According to an exemplary embodiment of the present invention, the display device further comprises a light emitting layer formed in the display region, wherein an image is displayed on a surface of the substrate opposite the surface on which the connecting part is disposed.

According to an exemplary embodiment of the present invention, the display device further comprises a light emitting layer formed in the display region, wherein light from the light emitting layer travels toward the insulating substrate.

According to an exemplary embodiment of the present invention, the display device further comprises a light emitting layer formed in the display region and a common electrode formed on the light emitting layer, wherein light from the light emitting layer travels toward the insulating substrate and wherein the connecting part is formed on the common electrode.

The foregoing and/or other aspects of the present invention are achieved by providing a display device including; an insulating substrate, a pair of pads disposed on the insulating substrate and provided on opposite sides of the insulating substrate, a power supply unit providing a voltage to one of the pads, and a voltage transmitting part transmitting the voltage to the other pad.

The foregoing and/or other aspects of the present invention are achieved by providing an exemplary embodiment of a display device including; an insulating substrate, a glass plate formed on the insulating substrate, pads disposed on opposing sides of the glass plate, and a plurality of connecting parts disposed on the glass plate and electrically connecting the pads.

The foregoing and/or other aspects of the present invention are achieved by providing an exemplary embodiment of a display device including; an insulating substrate, a display region disposed on the insulating substrate, at least one pad disposed in a non-display region on the insulating substrate, wherein the at least one pad applies a voltage to the display region, a frame disposed adjacent to the insulating substrate, wherein the frame comprises a conducting part which electrically connects at least two portions of the pad or at least two pads, and a power supply unit which applies the voltage to the pad.

According to an exemplary embodiment of the present invention, the conducting part at least partially contacts the pad.

According to an exemplary embodiment of the present invention, the voltage is one of a driving voltage and a common voltage.

According to an exemplary embodiment of the present invention, the conducting part comprises a plurality of strips which connect one side of the frame with the opposing side thereof.

BRIEF DESCRIPTION OF THE DRAWINGS

The above and/or other aspects, features and advantages of the present invention will become apparent and more readily appreciated from the following description of the exemplary embodiments, taken in conjunction with the accompanying drawings of which.

DETAILED DESCRIPTION OF THE INVENTION

Figure 1:
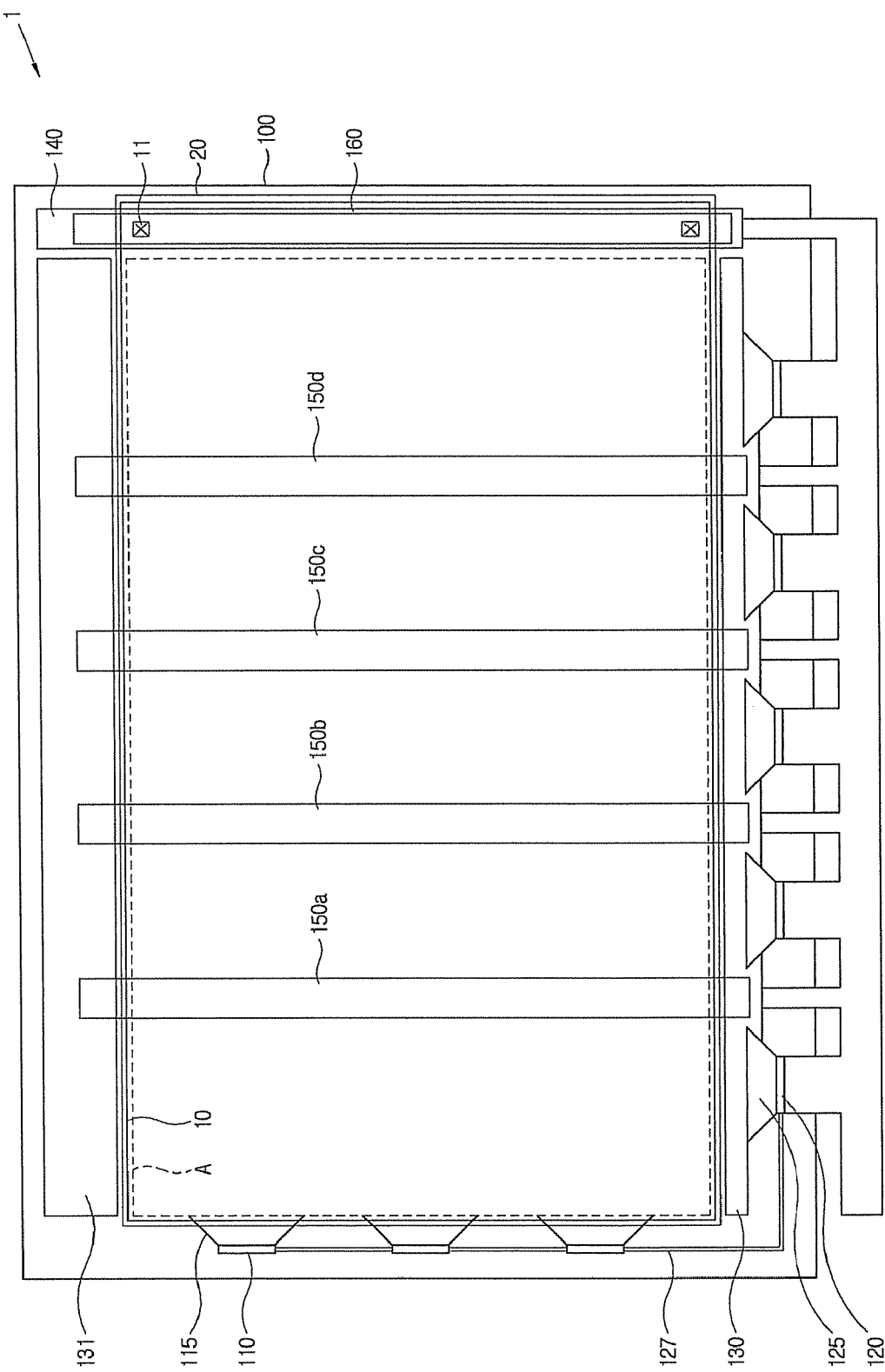
FIG. 1 is a schematic view of a first exemplary embodiment of a display device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

In the following exemplary embodiments, a display device utilizing an organic light emitting diode ("OLED") is described, however, the present invention is not limited thereto. Alternative exemplary embodiments which utilize other display devices in which a certain level of voltage is supplied to drive the display devices would also be within the scope of the present invention.

Figure 2:
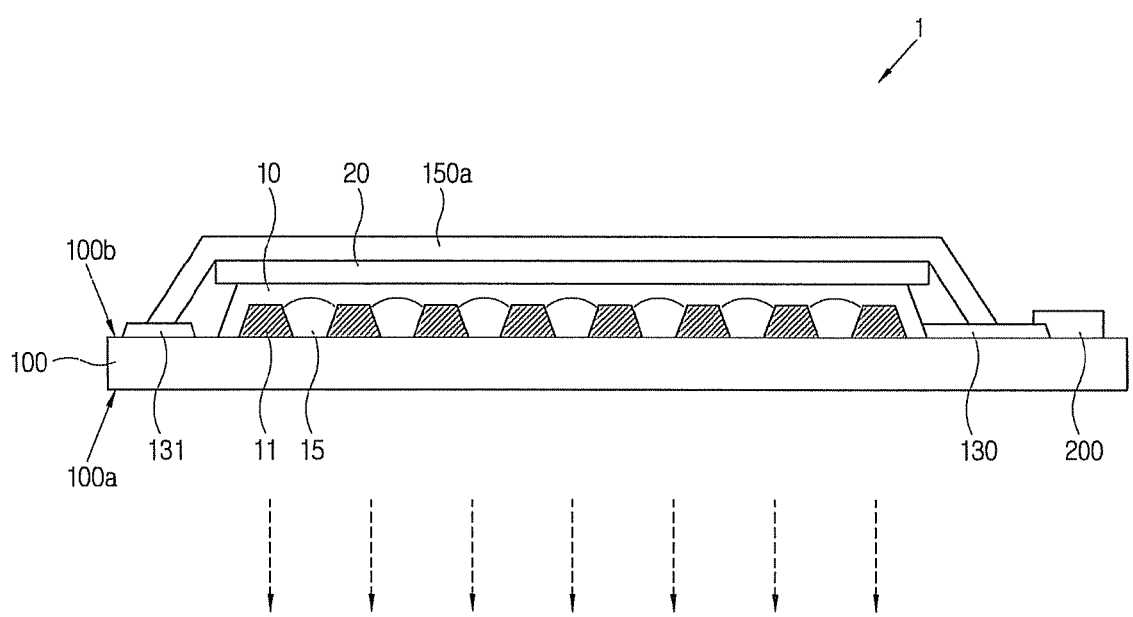
FIG. 2 is a cross-sectional view of the first exemplary embodiment of a display device according to the present invention.

FIG. 1 is a schematic view of a first exemplary embodiment of a display device according to the present invention; and FIG. 2 is a cross-sectional view of the first exemplary embodiment of a display device according to the present invention.

A first exemplary embodiment of a display device 1 according to the present invention includes an insulating substrate 100, a gate driving part 110, a data driving part 120, voltage supply pads 130 and 131 and a common voltage supply pad 140. The insulating substrate 100 includes a display region A and a non-display region. The gate driving part 110, the data driving part 120, the voltage supply pads 130 and the common voltage supply pad 140 are disposed in the non-display region. The voltage supply pads 130 and 131 are spaced opposite each other across the display region A. The common voltage supply pad 140 is disposed opposite to the gate driving part 110 across the display region A.

Further, a common electrode 10 supplying a common voltage to the display region A and a glass plate or a second substrate 20 covering the common electrode 10 and a portion of the common voltage supply pad 140 are formed on the insulating substrate 100.

Connecting parts 150a, 150b, 150c, 150d and 160, exemplary embodiments of which are made from metal, are formed on the glass plate 20. Metal may include Ag (silver), Al (aluminum), Cu (copper), Mo (molybdenum), Au (gold), etc. The connecting parts 150a, 150b, 150c, 150d and 160 electrically connect the voltage supply pads 130 and 131. The connecting parts 150a, 150b, 150c, 150d are connected to the voltage supply pads 130 and 131, and the connecting part 160 is connected to both the end portions of common voltage supply pad 140. A power supply unit 200 supplies a gate voltage, a data voltage, a driving voltage and a common voltage to the display region A, and is connected to the data driving part 120, the voltage supply pad 130 and the common voltage supply pad 140. Signal line patterns 127 are formed between the gate driving part 11 and the data driving part 120 on the insulating substrate 100. The gate voltage from the power supply unit 200 is supplied to the gate driving part 110 through the data driving part 120 and the signal line patterns 127. The power supply unit 200 includes a voltage generator generating various kinds of voltages, and in one exemplary embodiment, it is provided as a flexible printed circuit ("FPC") where a circuit to generate voltages is mounted. The power supply unit 200 extends beyond the edge of the display device 1 so that when the formation of the display device 1 is completed the power supply may be disposed behind the display region A. A gate on/off voltage is supplied to the gate driving part 110 through a wiring pattern (not shown) formed on the insulating substrate 100.

The display region A shown in FIG. 1 includes gate lines (not shown); data lines (not shown) and power supply lines (not shown) both of which extend substantially perpendicular to the gate line; and a plurality of pixels in substantially rectangular shape defined by these lines crossing substantially perpendicular to each other. The voltage supply lines are formed substantially parallel with the data lines. The voltage supply lines are generally formed in the same layer of the display device as the data lines, e.g., a data metal layer. Also shown in FIG. 1 are a gate fan out part 115 and a data fan out part 125 to be described in more detail below.

As shown in FIG. 2, a light emitting layer 15 and a wall 11 are formed on each of the pixels. The light emitting layer 15 includes an organic light emitting material, which, when operated, emits light to the outside. The wall 11 divides the light emitting layer 15 into a plurality of parts. In the present exemplary embodiment of a display device, the light from the light emitting layer 15 exits to a first surface 100a of the insulating substrate 100 where the connecting parts 150a, 150b, 150c, 150d and 160 are not formed. That is, the connecting parts 150a, 150b, 150c, 150d and 160, the pads 130, 131 and 140, and the power supply unit 200 are formed on a second surface 100b of the insulating substrate 100 where they will not degrade the image quality of the display, and thus the pads 130, 131 and 140 and the connecting parts 150a, 150b, 150c, 150d and 160 are not visible from the first surface 100a.

In a bottom-emission display device described above, as the pads 130, 131 and 140 and the power supply unit 200 are formed on the second surface 100b, opposite to the first surface 100a where the light exits, the connecting parts 150a, 150b, 150c, 150d and 160, which connect the pads 130, 131 and 140, may be seated on the insulating substrate 100 without being bent. The connecting parts 150a, 150b, 150c, 150d and 160 are not bent or warped, thereby promptly supplying a voltage from the power supply unit 200 and having relatively low-resistance compared with a bent structure.

The connecting parts according to the present exemplary embodiment may also be employed in a top-emission display device. In such an exemplary embodiment, connecting parts are formed on the face of an insulating substrate opposite to the light emitting surface, similar to the bottom-emission type display described above. However, in a top-emission type display pads and a power supply unit are formed on the same surface as a light emitting layer, and the connecting parts are bent to an opposing surface of the insulating substrate.

Figure 3:
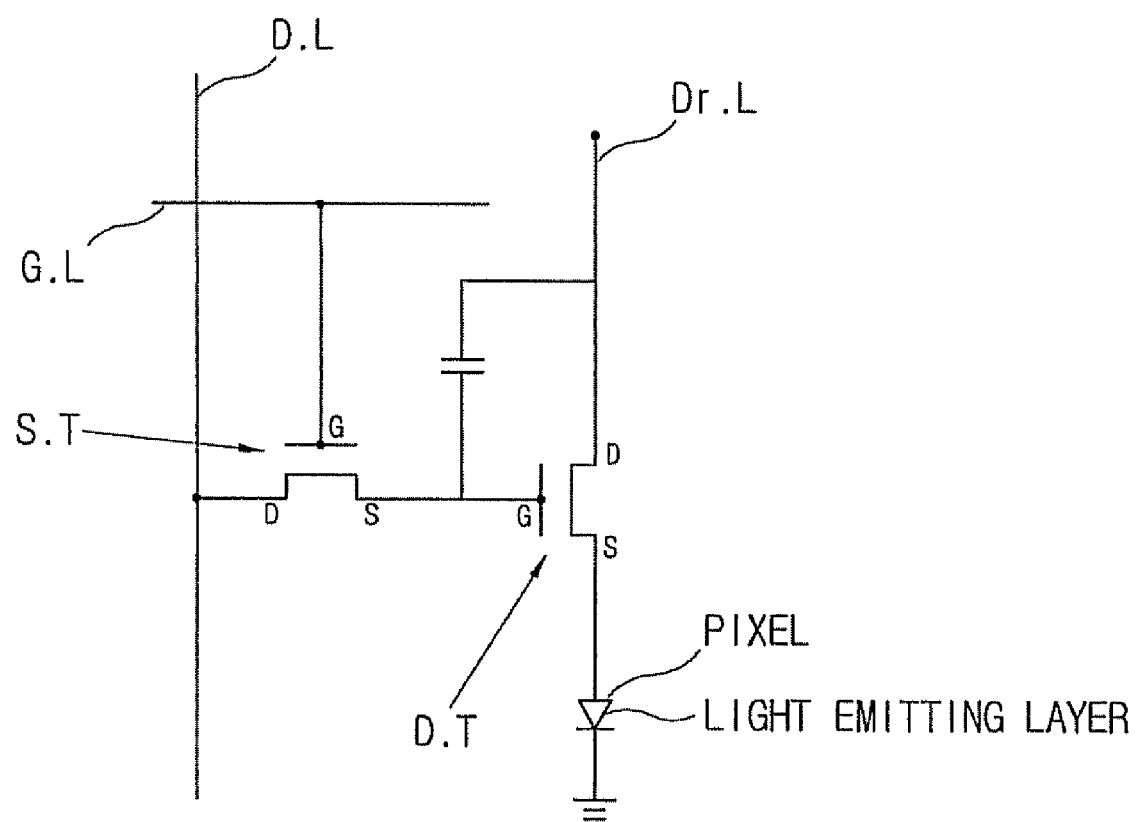
FIG. 3 is an equivalent circuit schematic diagram of a pixel according to the first embodiment of the present invention.

Referring to FIG. 3, an equivalent circuit schematic diagram of a pixel formed under the common electrode 10 will be described as follows.

One pixel includes a switching transistor S.T which is electrically connected to a gate line G.L and a data line D.L, a driving transistor D.T which is electrically connected to a source electrode S of the switching transistor S.T and a voltage supply line Dr.L, and a pixel electrode which is physically and electrically connected to the driving transistor D.T. The pixel includes a light emitting layer which may emit light by applying a voltage from the pixel electrode.

The gate lines G.L are disposed substantially parallel to each other and cross the data lines D.L and the voltage supply lines Dr.L to define pixels. A gate metal layer includes the gate lines G.L and gate electrodes G of the transistors S.T and D.T and may be a single layer of gate material or a multiple layers of gate material. The gate lines G.L apply the gate on/off voltage to the switching transistors S.T which are connected to each of the gate lines G.L.

A data metal layer includes the data lines D.L, which cross the gate lines G.L, and drain electrodes D and source electrodes S of the transistors S.T and D.T. The data metal layer is insulated from the gate metal layer. The data lines D.L apply a data voltage to the switching transistor S.T.

The voltage supply lines Dr.L are disposed substantially parallel with the data lines D.L and cross the gate lines G.L to form the pixels in substantially a matrix shape. The voltage supply lines are generally disposed in the same layer as the data lines, e.g., they may be formed in the data metal layer. According to one exemplary embodiment, one voltage supply line Dr.L may be disposed in every pixel. However, alternative exemplary embodiments include configurations wherein a voltage supply line Dr.L is disposed between two pixels. Two adjacent pixels sharing one voltage supply line may be applied with a driving voltage through the voltage supply line. In the exemplary embodiment of the present invention wherein a voltage supply line is shared between at least two pixels the display device includes fewer lines, a manufacturing process thereof is simplified and electromagnetic interference decreases.

The switching transistor S.T includes a gate electrode G, which is connected to a portion of the gate line G.L; the drain electrode D which is branched from the data line D.L; the source electrode S which is separated from the drain electrode D; and a semiconductor layer formed between the drain electrode D and the source electrode S. The gate on voltage, which is applied to the gate line G.L, is transmitted to the gate electrode G of the switching transistor S.T. Accordingly, the data voltage applied from the data line D.L is output to the source electrode S through the drain electrode D.

The driving transistor D.T controls an electric current between the drain electrode D and the source electrode S according to the data voltage provided to the gate electrode G thereof. A voltage applied to the pixel electrode through the source electrode S corresponds to a difference between the data voltage provided to the gate electrode G and the driving voltage provided to the drain electrode D.

When the display device uses an OLED the pixel electrode functions as an anode and provides holes to the light emitting layer thereof. However, in alternative exemplary embodiments, the pixel electrode may be used to provide the voltage difference between it and a common electrode necessary to twist a strand of liquid crystal therebetween.

The common electrode Vcom is provided throughout the display region A. Accordingly, an electric current in the light emitting layer passes through the common electrode Vcom.

Returning to FIG. 1, the gate driving part 110 and the data driving part 120 are formed in the non-display region and each are connected to an end portion of the gate line and an end portion of the data line, respectively. The gate driving part 110 and the data driving part 120 apply driving signals received from the outside to the gate line and the data line. In the present exemplary embodiment the gate driving part 110 and the data driving part 120 are mounted on the insulating substrate 100 by a chip on glass ("COG") method. Alternative exemplary embodiments may use a tape carrier package ("TCP") method wherein the driving parts are adhered to a polymer film and then mounted on an insulating substrate, or a chip on film ("COF") method wherein the driving parts are mounted on a driving circuit board and adhered to an insulating substrate, or various other mounting techniques to connect the driving parts 110 and 120 to the insulating substrate 100. In the present exemplary embodiment, wherein the driving parts 110 and 120 are combined on the insulating substrate 100 by the COG method, the display may be spatially limited.

The gate line and the data line in the display region A extend to connect with the gate driving part 110 and the data driving part 120, respectively, outside the display region A. A gate fan out part 115 and a data fan out part 125 are formed in an area where the gate line and the data line connect to the gate driving part 110 and the data driving part 120, respectively. The gate fan out part 115 and the data fan out part 125 are formed where the wiring intervals are narrow.

The first voltage supply pad 130 is connected to end portions of the voltage supply lines and the second voltage supply pad 131 is connected to the other end portions of the voltage supply lines; both voltage supply pads 130 and 131 are disposed in the non-display region. In the present exemplary embodiment the first voltage supply pad 130 has a funnel shape formed between the data driving parts 120 and is bar shaped when it is not funnel shaped; additionally the entire supply pad 130 is formed substantially parallel to the gate line. In the present exemplary embodiment, the first voltage supply pad 130 is formed of the funnel shape and the bar shape as a single body and includes substantially the same gate metal material as the gate line. The first voltage supply pad 130 is connected to the power supply unit 200 and provided with a driving voltage from the power supply unit 200.

The second voltage supply pad 131 is disposed opposite to the first voltage supply pad 130 across the display region A and is connected to the first voltage supply pad 130 through the connecting parts 150a, 150b, 150c and 150d. The driving voltage applied to the first voltage supply pad 130 is transmitted to the second voltage supply pad 131 through the connecting parts 150a, 150b, 150c and 150d, and then applied to the voltage supply line through the second voltage supply pad 131. That is, the power supply unit 200 is directly connected to the first voltage supply pad 130, but the voltage supply line can receive the driving voltage from the second voltage supply pad 131 opposite the first voltage supply pad 130. Accordingly, the driving voltage is quickly and evenly provided throughout the display region A, and the amount of electric current is increased by an amount corresponding to a decrease of resistance due to an enlarged supplying space of the driving voltage.

In one exemplary embodiment, the connecting parts 150a, 150b, 150c and 150d may include copper with low resistance or may be formed on an FPC similar to the power supply unit 200. If the connecting parts 150a, 150b, 150c and 150d are included on an FPC, they may be formed in a single body with the power supply unit 200, thereby simplifying a manufacturing process of the display device.

In one exemplary embodiment, the connecting parts 150a, 150b, 150c and 150d each have the same area and are disposed substantially parallel with each other and are spaced at a substantially regular interval with each other considering resistance when the driving voltage is transmitted. If the connecting parts 150a, 150b, 150c and 150d each have different areas or are disposed at different intervals, the amount of the driving voltage to the second voltage supply pad 131 may vary, thereby generating a brightness difference in the display region A.

The common voltage supply pad 140 is disposed opposite to the gate driving part 110 across the display region A. The common voltage supply pad 140 is connected to the common electrode 10 and applies the common voltage provided from the power supply unit 200 to the common electrode 10. The common electrode 10 and the common voltage supply pad 140 are electrically connected through a contact hole 11. Alternatively, the common electrode 10 and the common voltage supply pad 140 may be contacted through a bridge electrode including indium tin oxide ("ITO") (not shown). The common voltage supply pad 140 is partially covered with the glass plate 20 extending from the display region A. End portions of the common voltage supply pad 140 are not covered with the glass plate 20 but are exposed to contact the connecting part 160. Accordingly, the common voltage provided from the power supply unit 200 can be applied from the opposite ends of the common voltage supply pad 140.

Figure 4:
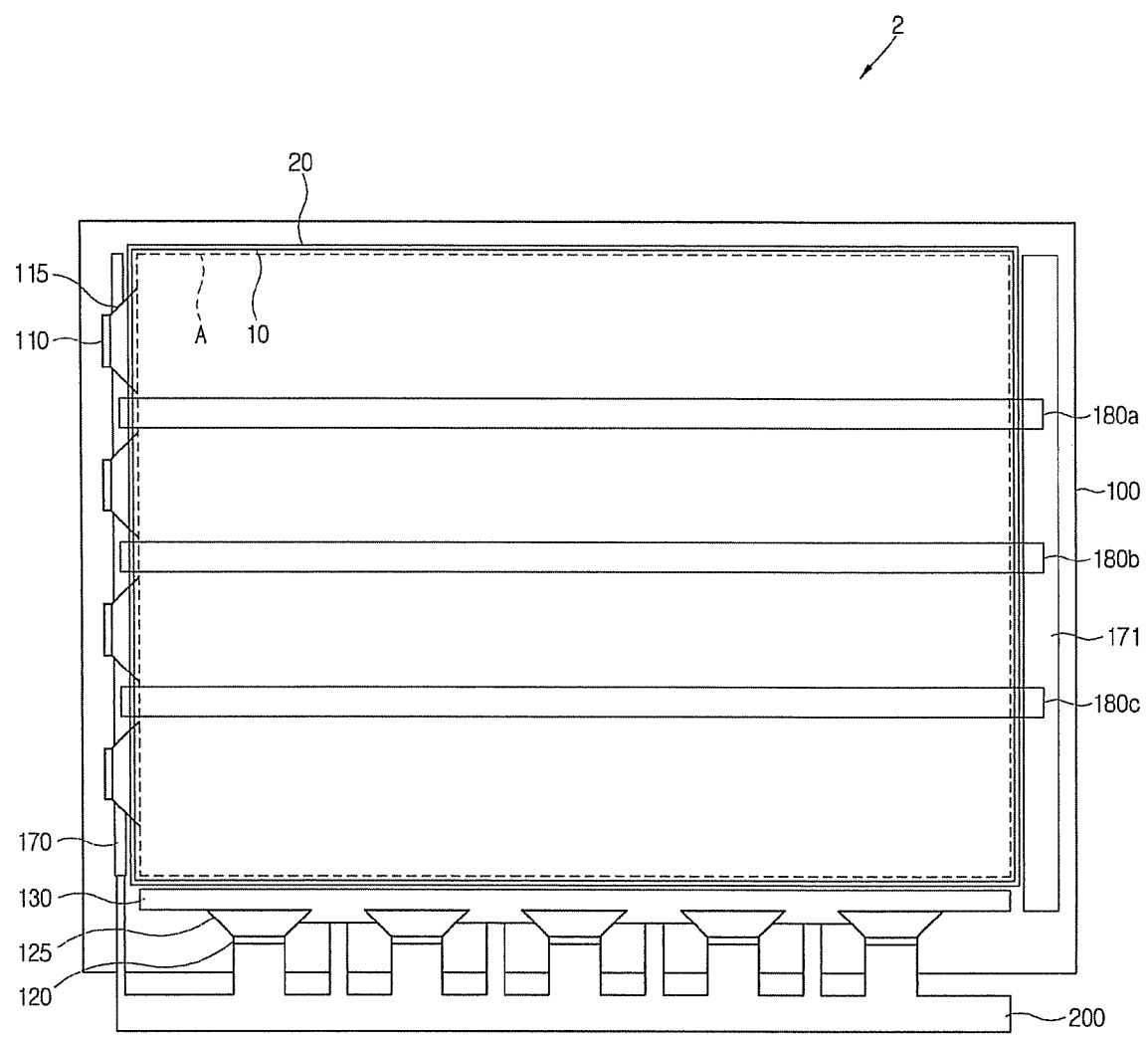
FIG. 4 is a schematic view of a second exemplary embodiment of a display device according to the present invention.

FIG. 4 is a schematic view of a second exemplary embodiment of a display device 2 according to the present invention. The second exemplary embodiment of a display device 2 includes many of the same elements as the first exemplary embodiment of a display device, and therefore the following description will be made to those features which differentiate this exemplary embodiment from the first exemplary embodiment, and description to the remaining similar features will not be repeated herein.

The second exemplary embodiment of a display device 2 according to the present invention includes a pair of common voltage supply pads 170 and 171 disposed opposite to each other across a display region A, and a voltage supply pad 130 disposed adjacent to a data driving part 120. Further, the display device 2 includes connecting parts 180a, 180b and 180c formed on a glass plate 20 between the common voltage supplying pads 170 and 171.

A first common voltage supply pad 170 is formed adjacent to a gate driving part 110 and is provided with a certain level of a common voltage from a power supply unit 200. The common voltage provided to the first common voltage supply pad 170 is transmitted to a second common voltage supply pad 171 through the connecting parts 180a, 180b and 180c, and then provided to opposite sides of a common electrode 10. The second exemplary embodiment of a display device 2 has connecting parts 180a, 180b and 180c which are equivalent to the connecting part 160 of the display device 1 of the first exemplary embodiment. The second exemplary embodiment has more connecting parts, e.g., 180a, 180b, 180c, connected to more common voltage supply pads, e.g., 170 and 171, so that the common voltage may be applied even more quickly and evenly throughout the display. The structure according to the present invention supplying common voltage from opposing sides of the rectangular display region A provides a more uniform common voltage across the display region A.

The exemplary embodiment of a display device 2 may include a pair of voltage supply pads to apply a driving voltage and connecting parts to connect the pair of voltage supply pads as in the first exemplary embodiment.

Figure 5A:
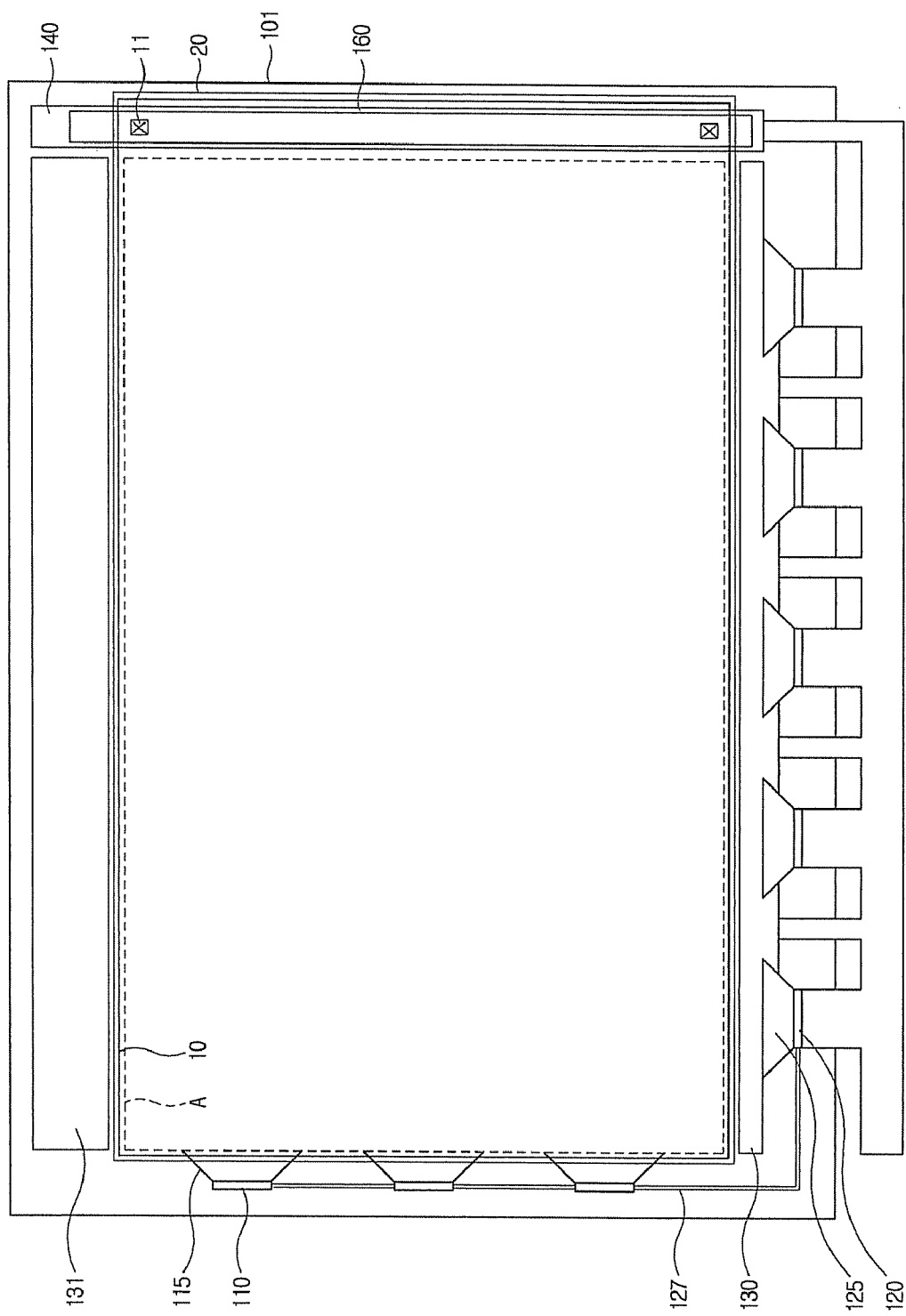
FIG. 5A is a schematic view of a third exemplary embodiment of a display device according to the present invention.

FIG. 5A is a schematic view of a third exemplary embodiment of a display device according to the present invention. FIG. 5A shows an insulating substrate according to the third exemplary embodiment of the present invention; and FIG. 5B is a schematic view of a frame to support the insulating substrate of the third exemplary embodiment of a display device shown in FIG. 5A.

An insulating substrate 101 is similar to the insulating substrate 100 shown in FIG. 1 except that it does not include a connecting part. That is, the insulating substrate 101 according to the present exemplary embodiment includes a pair of voltage supply pads 130 and 131, but does not include a connecting part to connect them.

Figure 5B:
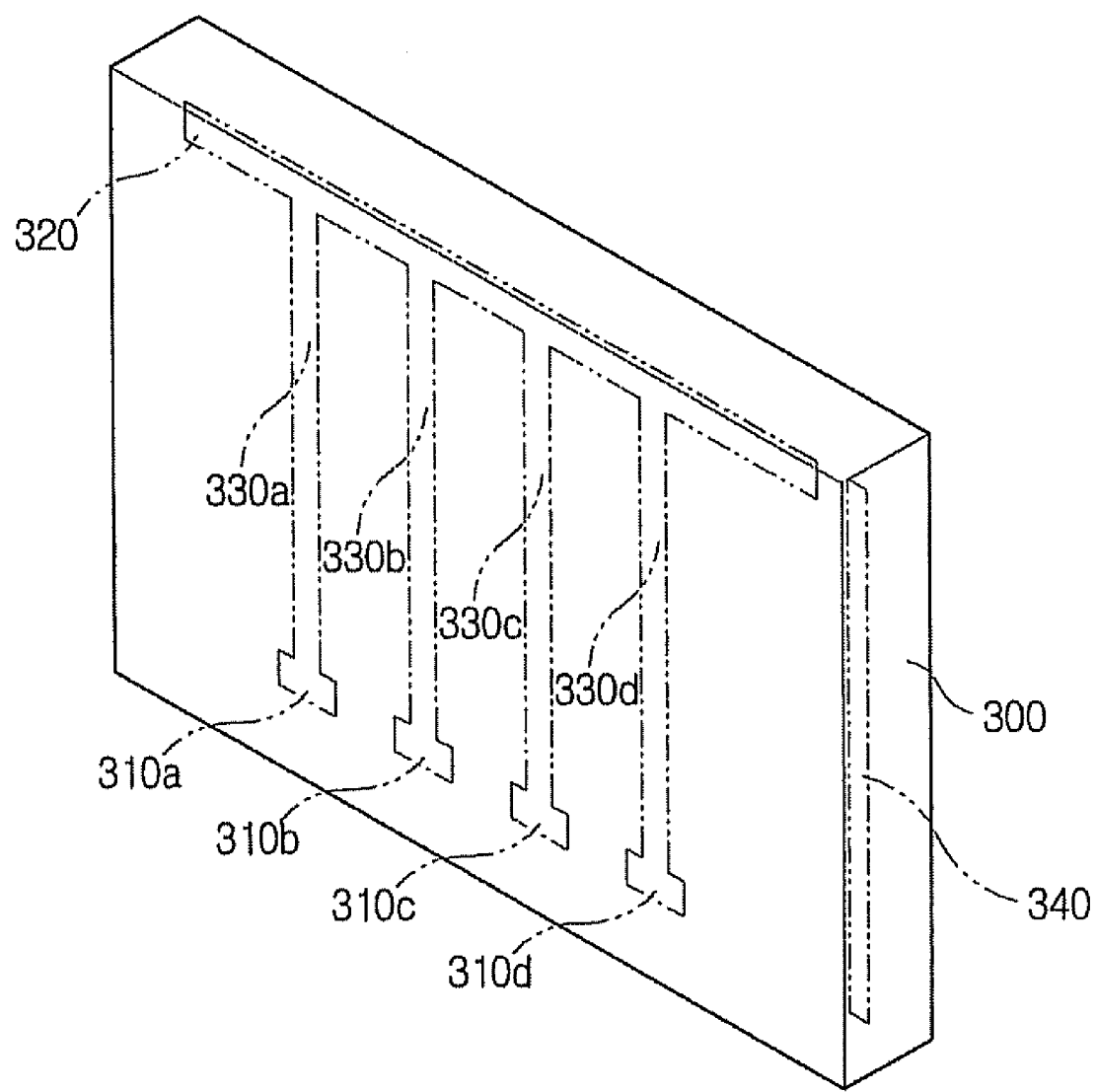
FIG. 5B is a schematic view of a frame to support an insulating substrate of the third exemplary embodiment of a display device shown in FIG. 5A.

A frame 300 shown in FIG. 5B includes conducting parts 310a, 310b, 310c, 310d, 320, 330a, 330b, 330c, 330d and 340. The frame 300 accommodates and supports the insulating substrate 101. The insulating substrate includes the wiring necessary for the display such as gate wiring, data wiring, etc. In the present exemplary embodiment, the conducting parts 310a, 310b, 310c, 310d, 320, 330a, 330b, 330c, 330d and 340 are disposed inside the frame 300, which according to one exemplary embodiment has the shape of a rectangular parallelepiped on a surface contacting with the insulating substrate 101, and contact the various components of the insulating substrate 101. The conducting parts 320, 310a, 310b, 310c, 310d, 330a, 330b, 330c and 330d contact and become electrically connected with the voltage supply pads 130 and 131 which are formed on the insulating substrate 101. The conducting part 340 contacts the opposite ends of the common voltage supply pad 140.

The conducting parts include first conducting parts 310a, 310b, 310c and 310d which contact the first voltage supply pad 130, a second conducting part 320 which contacts the second voltage supply pad 131, third conducting parts 330a, 330b, 330c and 330d which connect the first conducting parts 310a, 310b, 310c and 310d with the second conducting part 320, and a fourth conducting part 340 which contacts opposite end portions of the common voltage supply pad 140. In one exemplary embodiment the third conducting parts 330a, 330b, 330c and 330d and the fourth conducting part 340 are set out in long, relatively narrow strips connecting one side of the frame 300 to the opposite side thereof.

In an alternative exemplary embodiment the frame 300 may include the third conducting parts 330a, 330b, 330c and 330d and the fourth conducting part 340, and may omit the first conducting parts 310a, 310b, 310c and 310d and the second conducting part 320.

The conducting parts 310a, 310b, 310c, 310d, 320, 330a, 330b, 330c, 330d and 340 include a material to transmit a voltage, exemplary embodiments of which include metal. The third conducting parts 330a, 330b, 330c and 330d and the fourth conducting part 340 may be provided as an FPC similar to the connecting parts 150a, 150b, 150c, 150d and 160 as shown in the first exemplary embodiment.

Voltages, such as the driving voltage and the common voltage, which are provided to the entire display region A at a constant level, should be uniformly and sufficiently provided thereto in order to improve display characteristics thereof. Thus, in the present invention, the plurality of connecting parts 150a, 150b, 150c, 150d and 160 and the conducting parts 310a, 310b, 310c, 310d, 320, 330a, 330b, 330c, 330d and 340 are provided in the display device, thereby operating to distribute the voltage from a plurality of points distributed throughout the display area although the voltage is provided actually from one source. Accordingly, the voltage is sufficiently provided to the display region A, and thus brightness may be uniform throughout the display device.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents

What is claimed is:

1. A display device comprising:
a first insulating substrate comprising a display region and at least one non-display region;
at least two pads disposed in the at least one non-display region, the at least two pads apply a voltage to the display region;
at least one connecting part which electrically connects the at least two pads or at least two portions of the two pads; and
a power supply unit applies the voltage to the two pads,
wherein the at least two pads comprise a first pad and a second pad, the first pad and second pad are separated from each other with the display region disposed therebetween.

2. The display device according to claim 1, wherein the connecting part comprises metal.

3. The display device according to claim 1, wherein the connecting part comprises a flexible printed circuit.

4. The display device according to claim 3, wherein the connecting part is provided in a single body with the power supply unit.

5. The display device according to claim 1, further comprising at least one voltage supply line disposed in the display region, and wherein the voltage is a driving voltage applied to the voltage supply line.

6. The display device according to claim 1, wherein the at least one connecting part comprises a plurality of connecting parts.

7. The display device according to claim 6, wherein the connecting parts are disposed substantially parallel with each other.

8. The display device according to claim 1, further comprising at least one data line formed substantially parallel with the voltage supply line in the display region and a data driving part which applies a data voltage to the data line, wherein the data driving part is disposed adjacent to one of the first pad and the second pad.

9. The display device according to claim 8, wherein the data driving part is disposed on the first insulating substrate.

10. The display device according to claim 1, further comprising a light emitting layer formed in the display region and a common electrode formed on the light emitting layer, wherein light from the light emitting layer travels toward the first insulating substrate and wherein the connecting part is formed on the common electrode.

11. A display device comprising:
an insulating substrate comprising a display region and at lease non-region display region;
a pair of pads disposed on the insulating substrate and provided on opposite sides of the insulating substrate in the non-display region on the insulating substrate;
a power supply unit providing a voltage to one of the pads; and
a voltage transmitting part transmitting the voltage to the other pad,
wherein the pair of pads are separated from each other with the display region disposed therebetween.

12. A display device comprising:
an insulating substrate comprising a display region and at lease non-region display region;
a glass plate formed on the insulating substrate;
pads disposed on opposing sides of the glass plate in the non-display region on the insulating substrate; and
a plurality of connecting parts disposed on the glass plate and electrically connecting the pads,
wherein the pads comprise a first pad and a second pad, the first pad and second pad are separated from each other with the display region disposed therebetween.

13. The display device according to claim 1, wherein the connecting part is disposed in the display region.

14. The display device according to claim 1, further comprising a second substrate opposite the first insulating substrate.

15. The display device according to claim 14, wherein the connecting part is disposed on the second substrate.

16. The display device according to claim 15, further comprising a light emitting layer formed in the display region, wherein light from the light emitting layer travels toward the first insulating substrate.

17. The display device according to claim 1, wherein the display region includes a plurality of pixels.

* * * * *